(12) United States Patent
Kamoshima et al.

(10) Patent No.: US 6,740,564 B2
(45) Date of Patent: May 25, 2004

(54) METHOD FOR MANUFACTURING A SEMICONDUCTOR DEVICE

(75) Inventors: Takao Kamoshima, Tokyo (JP); Takeru Matsuoka, Tokyo (JP); Takashi Yamashita, Tokyo (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/192,629

(22) Filed: Jul. 11, 2002

(65) Prior Publication Data

US 2003/0100178 A1 May 29, 2003

(30) Foreign Application Priority Data

Nov. 27, 2001 (JP) .......................... 2001-361243

(51) Int. Cl.$^7$ ............................................ H01L 23/544
(52) U.S. Cl. .......................................................... 438/401
(58) Field of Search ................................ 438/401, 462, 438/654, 656, 627, 637

(56) References Cited

U.S. PATENT DOCUMENTS 5,637,924 A * 6/1997 Hibido ........................ 257/751
5,786,272 A * 7/1998 Marangon et al. .......... 438/628
6,191,027 B1 * 2/2001 Omura ........................ 438/627
6,352,904 B2 * 3/2002 Tan et al. ................... 438/401
2002/0072223 A1 * 6/2002 Gilbert et al. .............. 438/629

FOREIGN PATENT DOCUMENTS

| JP | 05-226280 | 9/1993 |
| JP | 08-203871 | 8/1996 |

* cited by examiner

Primary Examiner—David Nelms
Assistant Examiner—Quoc Hoang
(74) Attorney, Agent, or Firm—Burns, Doane, Swecker & Mathis, L.L.P.

(57) ABSTRACT

A method for manufacturing a semiconductor device wherein a contact hole formed in an interlayer insulating film on a semiconductor substrate is filled with a plug for electrically connecting an overlying conductor layer with an underlying conductor layer. The plug fills the contact hole, and comprised a tungsten film the upper end whereof is positioned below the upper surface of the interlayer insulating film, and a tungsten film which is filled on the tungsten film in the contact hole and the upper surface whereof is on substantially the same level as the upper surface of the interlayer insulating film.

8 Claims, 7 Drawing Sheets

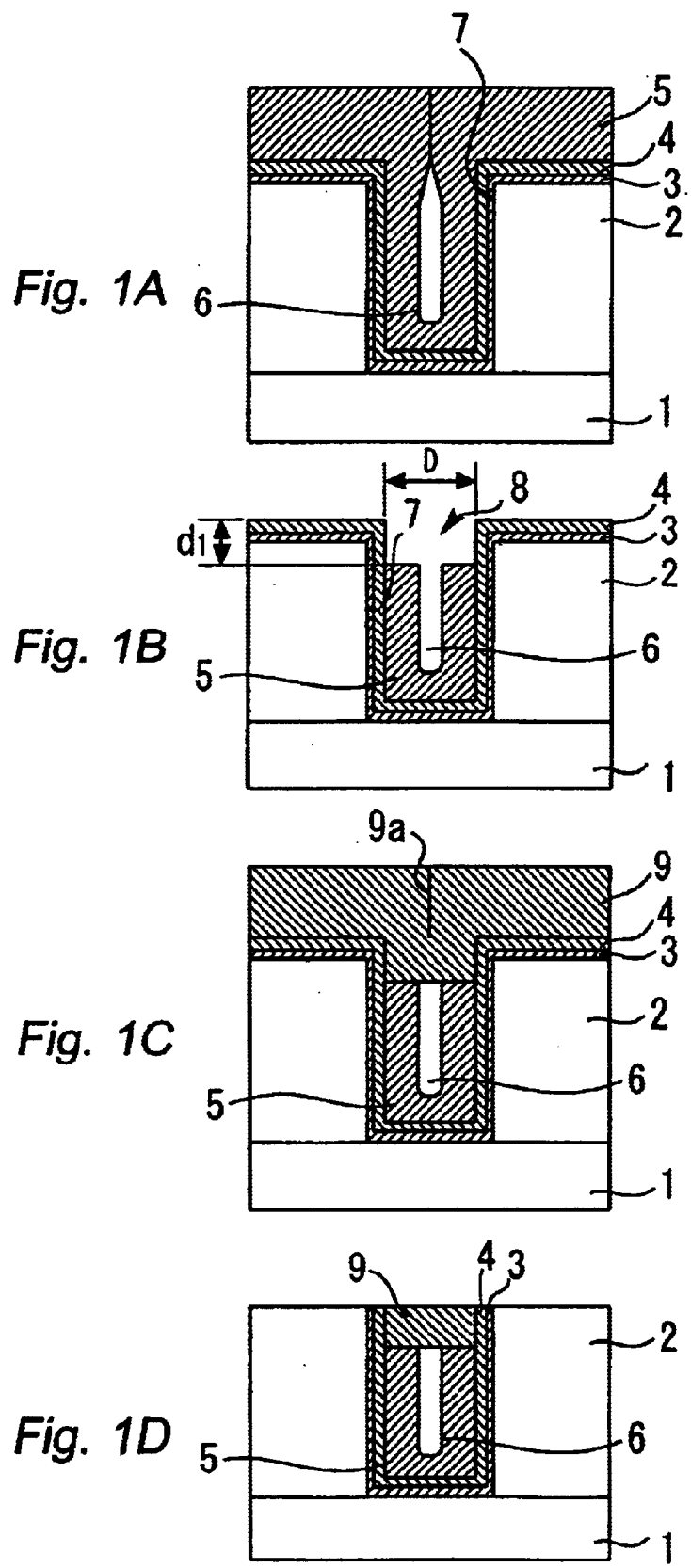

METHOD FOR MANUFACTURING A SEMICONDUCTOR DEVICE

BACKGROUND OF THE INVENTION

1. Field of the Invention

The present invention relates to a method for manufacturing a semiconductor device, and specifically to a semiconductor device comprising a plug for connecting between an upper conductive layer and a lower conductive layer.

2. Background Art

In recent semiconductor devices, a plug made of tungsten (W) is frequently used as a plug structure for filling a contact hole or a via hole. Known methods for forming tungsten plugs include a method utilizing etch back, and a method utilizing CMP (chemical mechanical polishing).

In the etch-back method, metal wiring must be embedded in the plug recess portion after forming a plug. On the other hand, in the plug forming method using CMP, since embedding of such metal wiring is not required, and the foreign matter formed in the formation of the tungsten film and the etch back of tungsten can be removed by CMP, short-circuiting between wirings can be reduced. Therefore, the plug forming method using CMP is becoming the main stream of plug forming.

In the plug forming method using CMP, aiming at the removal of metal contamination and foreign matter after polishing, cleaning with hydrogen fluoride (HF), which is inexpensive and easy to handle, is frequently used.

However, in the tungsten plug forming method using CMP, the degradation of electrical properties of wiring caused by voids, seams, or the like formed in the tungsten plug forming was unavoidable. Problems arisen in a conventional tungsten plug forming method will be described below referring to the drawings.

FIGS. 7A and 7B are schematic sectional views showing a method for forming a tungsten plug using CMP. FIG. 7A shows the state where after forming an interlayer insulating film 102 on an underlying wiring layer 101 to form a contact hole, and sequentially forming a titanium film 103 and a titanium nitride film 104 so as to cover the internal wall of the contact hole, a tungsten film 105 is formed using the CVD method to fill the contact hole. Here, the underlying wiring layer 101 may be a semiconductor substrate. In the state where the contact hole has been filled with the tungsten film 105, a seam portion 106 has been formed in the contact hole.

FIG. 7B shows the state where the tungsten film 105 on the interlayer insulating film 102 has been removed by polishing using CMP after the state shown in FIG. 7A, and the product has been cleaned using a hydrogen fluoride (HF) solution. By the removal of the tungsten film 105 on the interlayer insulating film 102, the tungsten film 105 fills only the inside of the contact hole 107, and a tungsten plug consisting of the tungsten film 105 is formed.

As FIG. 7B shows, since the hydrogen fluoride solution dissolves the titanium film 103 between the tungsten film 105 and the interlayer insulating film 102 rapidly in cleaning, the interlayer insulating film 102 positioned outside the contact hole moves back, and a gap 108 is formed.

If the gap 108 reaches the underlying wiring layer (or semiconductor substrate) 101, the underlying wiring layer (or semiconductor substrate) 101 is removed by hydrogen fluoride, and a void 109 as shown in FIG. 7B is formed.

A problem of increase in via resistance and contact resistance has arisen by the formation of such a void 109.

Also, the void 109 has caused open defects to occur. Thereby, increase in the speed of semiconductor devices has been disturbed, and the reliability of semiconductor devices has been lowered.

In the state after polishing shown in FIG. 7B, since the tungsten film 105 on the seam portion 106 is removed by polishing, the inside of the seam portion 106 is exposed upward. And the size of the seam portion 106 increases when hydrogen peroxide (aqueous solution of $H_2O_2$) used in polishing permeates into the seam portion 106. Therefore, a problem of decrease in the contact area of the tungsten film 105 with the overlying wiring has arisen.

FIGS. 8A and 8B are plan views showing a decreased contact area of the tungsten film 105 with the overlying wiring, and shows the state where a metal wiring 110 consisting of, for example, aluminum on the tungsten film 105 has been formed from the state shown in FIG. 7B. Here, FIG. 8A shows an example wherein the metal wiring 110 is formed so as to overlap with the seam portion 106, and FIG. 8B shows another example wherein the metal wiring 110 is formed beyond the seam portion 106. In FIGS. 8A and 8B, the hatched areas show the regions where the metal wiring 110 contacts with the tungsten film 105.

As FIG. 8A shows, when the metal wiring 110 is formed so as to overlap with the seam portion 106, the larger the size of the seam portion 106, the smaller the contact area of the metal wiring 110 with the plug consisting of the tungsten film 105. Thus, a problem that the decreased contact area of the metal wiring 110 with the tungsten film 105 lowers the reliability of semiconductor devices, such as EM resistance, has arisen.

Also, as FIG. 8B shows, when the metal wiring 110 is formed beyond the seam portion 106, the seam portion 106 is completely exposed upward. Therefore, when an aluminum alloy, which is a material of the metal wiring 110, is subjected to dry etching, side etch occurs on the side of the metal wiring 110 along the contours of the seam portion 106. Thereby, a problem that the reliability of semiconductor devices, such as EM resistance, is deteriorated by decrease in the contact area, has arisen.

Furthermore, another problem that a wet solution permeates into the seam portion 106 corroding the plug has arisen when the tungsten film 105 is polished by CMP using hydrogen peroxide, when the tungsten film 105 is cleaned after polishing, or when a polymer is removed during etching for forming the overlying metal wiring. Therefore, a problem of the deterioration of electrical properties of the plug has arisen.

In addition, when a tungsten plug is formed by polishing the tungsten film 105 using CMP, a problem of the deterioration of the accuracy of the alignment and superposition test marks for the photoengraving of the metal wirings, has arisen.

FIGS. 9A and 9B are schematic sectional views showing the state where the accuracy of the alignment and superposition test marks has been deteriorated. Here, FIG. 9A shows the state immediately after the tungsten film 105 is formed, and FIG. 9B shows the state after polishing using CMP.

In FIGS. 9A and 9B, a tungsten film 105 is formed through a barrier metal film 111 in an opening 112 formed in an interlayer insulating film 102. Here, the barrier metal film 111 is a laminated film of a titanium film 103 and a titanium nitride film 104 shown in FIGS. 7A and 7B. As FIG. 9A shows, since the tungsten film 105 is formed along the internal wall of the opening 112, a step 105a is formed on the center of the opening 112 in the state after polishing shown in FIG. 9B. The alignment and superposition for the photoengraving of the metal wirings is tested using this step 105a.

However, since the tungsten film 105 on the bottom of the opening 112 of the interlayer insulating film 102 in the test mark portion is not completely removed by polishing using CMP, a problem that the step 105a becomes small has arisen.

Therefore, when a tungsten plug is formed using CMP, if the step 105a in the alignment and superposition test mark portion is formed together with the tungsten plug, the step 105a becomes shallow, and the detection of the step 105a in test becomes difficult. Therefore, a problem that the accuracy of alignment and superposition detection is lower than in the case of using the etch-back method, has arisen.

SUMMARY OF THE INVENTION

The present invention aims at the solution of the above-described problems, and the object of the present invention is to improve the electrical properties and reliability of plugs in semiconductor devices, and to achieve the improvement of the accuracy of alignment and superposition tests.

According to one aspect of the present invention, a method for manufacturing a semiconductor device comprises following steps. An insulating film is formed on a semiconductor substrate. An opening passing through the insulating film is formed by selectively removing the insulating film. A first adhering layer is formed so as to cover the internal wall and the bottom of the opening. A first conductive film is formed so as to fill the area on the insulating film and in the opening. A recess is formed by etching the first conductive film so that the first conductive layer is removed from the insulating film. And the upper surface of the first conductive film remaining in the opening is lower than the upper surface of the insulating film. A second conductive film is formed in the recess and on the insulating film. The recess is filled with the second conductive film by polishing the second conductive film until the insulating film is exposed.

Since the conductor for filling the opening is made to be a two-stage structure consisting of a first conductive film and a second conductive film, the gap (seam portion) within the opening can be tightly sealed. Therefore, decrease in the contact area with the overlying wiring connected to the conductor by the gap can be inhibited. Thereby, the contact resistance with the overlying wiring can be reduced, and reliability such as EM resistance can be improved.

Other and further objects, features and advantages of the invention will appear more fully from the following description.

BRIEF DESCRIPTION OF THE DRAWINGS

FIGS. 1A through 1D and 2A through 2D are schematic sectional views illustrating a method for manufacturing a semiconductor device according to First Embodiment in the order of process steps.

FIGS. 2A through 2D are schematic sectional views showing the alignment mark portion and the superposition test mark portion for photoengraving formed in another region on the semiconductor substrate.

DETAILED DESCRIPTION OF THE PREFERRED EMBODIMENTS

Figure 2A:
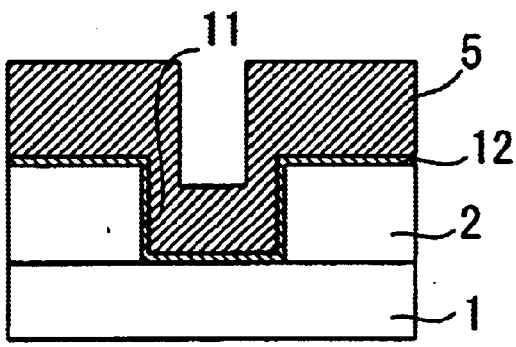

Some embodiments of the present invention will be described below referring to the drawings.
First Embodiment
FIGS. 1A through 1D and 2A through 2D are schematic sectional views illustrating a method for manufacturing a semiconductor device according to First Embodiment in the order of process steps. The structure and the manufacturing method of a semiconductor device according to First Embodiment will be described below referring to FIGS. 1A through 1D and 2A through 2D.

First, an interlayer insulating film 2 is formed on a conductive layer 1 so as to cover the conductive layer 1 with the interlayer insulating film 2. Here, the conductive layer 1 is a semiconductor substrate or a wiring layer formed on a semiconductor substrate. Next, the interlayer insulating film 2 is selectively removed to form a contact hole 7 (opening) reaching the conductive layer 1. Thereafter, a barrier metal film (first adhering layer) composing of a laminated film consisting of a titanium film 3 and a titanium nitride film 4 is formed on the internal wall of the contact hole 7 and on the interlayer insulating film 2, and a tungsten film 5 (first conductive film) is formed on the barrier metal film to fill the contact hole 7. At this time a seam portion 6 (gap) is formed in the tungsten film 5 in the contact hole 7. This state is shown in FIG. 1A.

Next, as FIG. 1B shows, etch back is performed using the titanium nitride film 4 as a stopper. Thereby, the tungsten film 5 is removed from the interlayer insulating film 2, and a predetermined quantity of the tungsten film 5 in the contact hole 7 is removed. And as FIG. 1B shows, a recess 8 having a depth $d_1$ from the upper surface of the titanium nitride film 4 and a diameter D is formed. Thereby, the seam portion 6 formed in the contact hole 7 is exposed outward.

Next, as FIG. 1C shows, a tungsten film 9 (second conductive film) is formed to fill the recess 8. Thereby, the tungsten film 9 is laminated on the tungsten film 5 in the contact hole 7, and the exposed seam portion 6 is sealed by the tungsten film 9.

Next, as FIG. 1D shows, the tungsten film 9 is polished using CMP. Here, since the recess 8 is a shallow hole, the coverage of the tungsten film 9 on the bottom of the recess 8 is substantially the same as the coverage on the side of the recess 8. Therefore, when a tungsten film 9 is formed in the recess 8 in the process step shown in FIG. 1C, the tungsten film 9 is deposited upward from the bottom of the recess 8, as well as in the lateral direction from the side of the recess 8, and a seam portion 9a is also formed on the tungsten film 9. As FIG. 1C shows, in the state where the seam portion 9a is adhered, since a tungsten film 9 of a thickness of D/2 is deposited from the side wall of the recess 8, and the coverage is uniform, the lower end of the seam portion 9a is positioned above the bottom of the recess 8 by D/2. Therefore, if the recess 8 is formed in the state of FIG. 1B so as to be D/2>$d_1$, the lower end of the seam portion 9a is always above the upper surface of the titanium nitride film 4, and the seam portion 9a is never exposed upward by polishing using CMP shown in FIG. 1D. Thus, if the shape of the recess 8 is established so as to be D/2>$d_1$, the presence of the remaining seam portion 9a on the tungsten film 9 in the state of FIG. 1D can be inhibited. Thus, a tungsten plug (conductor) of a two-stage structure consisting of tungsten films 5 and 9 can be formed in the contact hole 7 without leaving the seam portion 9a on the upper surface.

Even if the condition of D/2>$d_1$ is not satisfied, since the depth $d_1$ of the recess 8 is shallow, the recess 8 can be filled by the film thickness of the tungsten film 9. Therefore, even if the diameter and depth of the recess 8 is not specified, the occurrence of the seam portion on the tungsten film 9 can be prevented because the plug has a two-stage structure.

Since the tungsten plug can be made to have a two-stage structure, and the upward exposure of the seam portion 6 can be prevented, the contact area of the tungsten plug with the metal wiring can be secured sufficiently when the overlying metal wiring to be connected to the tungsten plug is formed. Therefore, the electrical resistance of the contact between the tungsten plug and the metal wiring can be lowered, and the reliability of the contact, such as EM resistance, can be improved. Also, by preventing the upward exposure of the seam portion 6, the corrosion of the tungsten plug during polishing using CMP, or following cleaning or the like can be prevented.

Next, the step for forming the alignment mark and the superposition test mark formed together with the tungsten plug of FIGS. 1A through 1D will be described below referring to FIGS. 2A through 2D. FIGS. 2A through 2D are schematic sectional views showing the alignment mark portion and the superposition test mark portion for photoengraving (hereafter referred to "mark portion") formed in another region on the semiconductor substrate.

First, as FIG. 2A shows, an interlayer insulating film 2 is formed on a conductive layer 1, and by selectively removing the interlayer insulating film 2, an opening 11 extending to the conductive layer 1 is formed. Thereafter, a barrier metal film 12 is formed on the internal wall of the opening 11 and on the interlayer insulating film 2, and a tungsten film 5 is formed on the barrier metal film 12 to fill the opening 11. Here the barrier metal film 12 is composed of a laminated film consisting of a titanium film 3 and a titanium nitride film 4 as FIGS. 1A through 1D show. This process step corresponds to the process step of FIG. 1A.

Figure 2B:
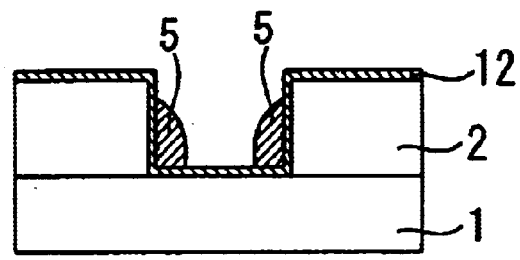

Next, as FIG. 2B shows, etch back is performed using the barrier metal film 12 as a stopper. Thereby, the tungsten film 5 is removed from the interlayer insulating film 2 and the opening 11, and the barrier metal film 12 on the bottom of the opening 11 is exposed. In the opening 11, the tungsten film 5 remains on a part of the sidewall. This process step corresponds to the process step of FIG. 1B. Thus, in the mark portion, since the opening 11 of a width larger than the depth of the interlayer insulating film 2 is usually formed, after the etch back of the tungsten film 5, the tungsten film 5 on the bottom of the opening 11 is completely etched back, and the underlying barrier metal film 12 is exposed as FIG. 2B shows.

Figure 2C:
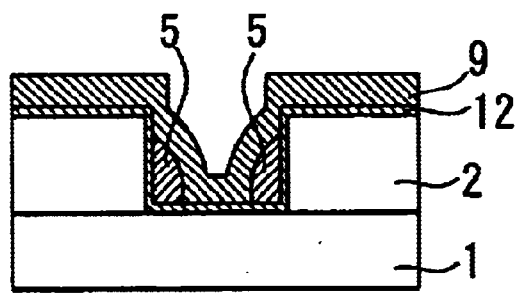

Next, as FIG. 2C shows, a tungsten film 9 is formed to cover the tungsten film 5 and the barrier metal film 12 in the opening 11. This process step corresponds to the process step of FIG. 1C.

Figure 2D:
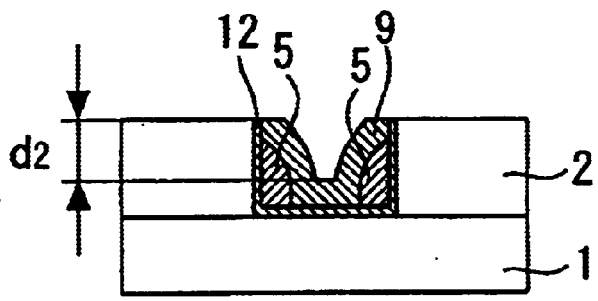

Next, as FIG. 2D shows, the tungsten film 9 and the barrier metal film 12 on the interlayer insulating film 2 are removed by polishing using CMP. This process step corresponds to the process step of FIG. 1D. Thereby, the tungsten film 9 is left only in the opening 11. In the process step shown in FIG. 2B, in order to etch back until the barrier metal film 12 in the opening 11 is exposed, a step 9a of a sufficient depth (=$d_2$) is formed on the surface of the tungsten film 9, as FIG. 2D shows.

In particular, since the tungsten film 9 is formed only for filling the recess 8 of the contact hole 7 shown in FIGS. 1A through 1D, it is sufficient to determine the film thickness of the tungsten film 9 to be the film thickness of the recess 8 or below. Thereby, as FIG. 2D shows, the step 9a on the surface of the tungsten film 9 can be deepened even after the tungsten film 9 has been polished. Therefore, it is ensured that the step 9a is formed in the mark portion, and the alignment and super position test for photoengraving can be performed at a high accuracy.

According to First Embodiment, as described above, since the tungsten plug is made to be a two-stage structure consisting of a tungsten film 5 and a tungsten film 9, the seam portion 6 in the contact hole 7 can be sealed tightly. Therefore, decrease in the contact area with the overlying wiring connected to the tungsten plug by the seam portion 6 can be prevented. Thereby, it can be ensured that the contact area of the tungsten plug with the overlying wiring is sufficiently widened, and decrease in electrical resistance in the contacting portion with the overlying wiring can be achieved. Also, since the contact area of the tungsten plug with the overlying wiring can be widened, reliability such as EM resistance can be improved. In addition, since the seam portion 6 is tightly sealed, the permeation of the polishing liquid used in CMP, the etching solution in the following process steps, and the cleaning solution into the seam portion 6 can be inhibited, and the corrosion of the tungsten plug can be prevented.

Furthermore, in the alignment mark portion and the superposition test mark portion for photoengraving, since the tungsten film 5 is removed by etch back until the bottom of the opening 11 is exposed, and the tungsten film 9 of the thickness substantially the same as the depth of the recess 8 in the region to form the contact hole 7 is formed, the tungsten film 9 can be formed along the internal wall of the opening 11. Therefore, the step 9a on the surface of the tungsten film 9 can be made sufficiently deep, it can be ensured that the step 9a is detected. Thereby, the accuracy of the alignment adjustment and the superposition test in photoengraving can be improved significantly.

Second Embodiment

Figure 3A:
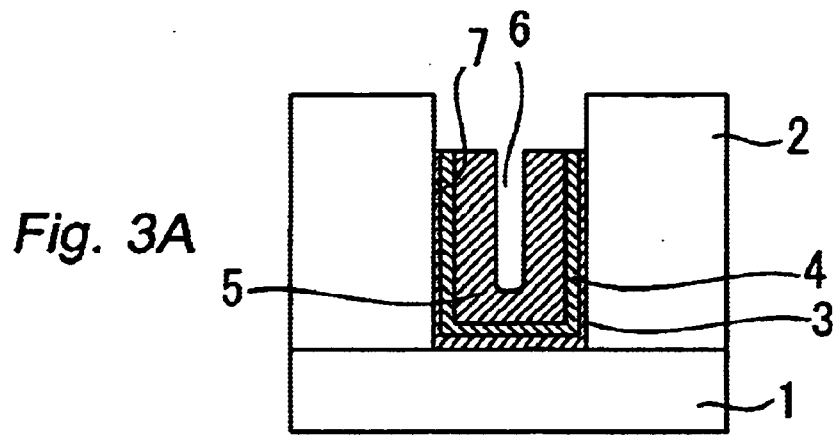
FIGS. 3A through 3C are schematic sectional views illustrating a method for manufacturing a semiconductor device according to Second Embodiment in the order of process steps.
Figure 3B:
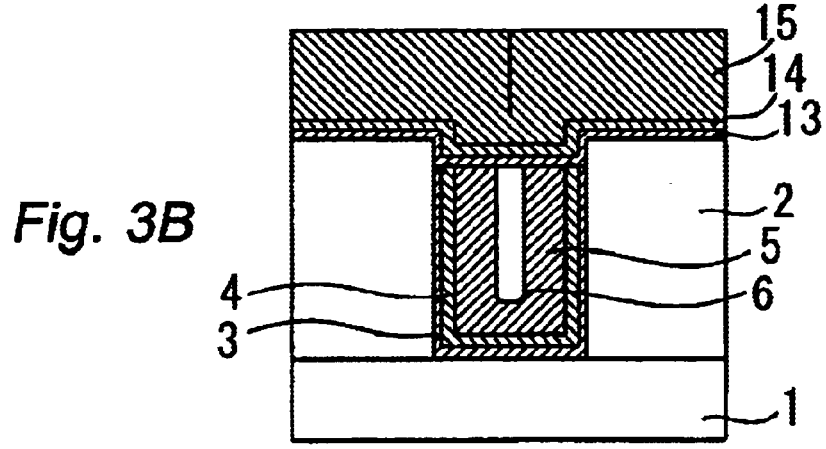
Figure 3C:
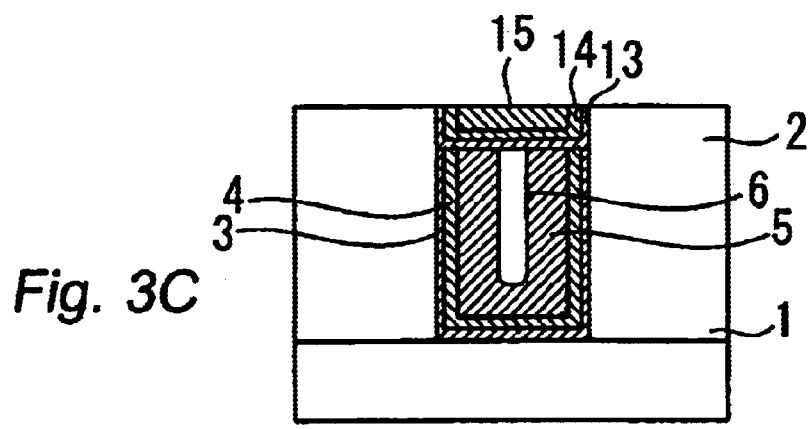

FIGS. 3A through 3C are schematic sectional views illustrating a method for manufacturing a semiconductor device according to Second Embodiment in the order of process steps. The structure and the manufacturing method of a semiconductor device according to Second Embodiment will be described below referring to FIGS. 3A through 3C. In FIGS. 3A through 3C, the same reference numerals are used for the same constituting components as in First Embodiment.

In the manufacturing process of Second Embodiment, the process step shown in FIG. 1A of First Embodiment is carried out in the same manner as in First Embodiment. FIG. 3A shows the state where the tungsten film 5 has been etched back after the process step shown in FIG. 1A of First Embodiment. Here, in Second Embodiment, the interlayer insulating film 2 is used as the stopper for etch back. Therefore, as shown in FIG. 3A, in the contact hole 7, the titanium film 3 and the titanium nitride film 4 above the upper surface of the tungsten film 5 have been removed. Also, in the region other than the contact hole 7, the titanium film 3 and the titanium nitride film 4 on the interlayer insulating film 2 have been removed, and the interlayer insulating film 2 has been exposed. In the state shown in FIG. 3A, a seam portion 6 is formed in the tungsten film 5 as in First Embodiment.

After the process step shown in FIG. 3A, as FIG. 3B shows, a titanium film 13 and a titanium nitride film 14 are sequentially formed on the tungsten film 5 and the interlayer insulating film 2 in the contact hole 7, and a barrier metal film (second adhering layer) consisting of the titanium film 13 and the titanium nitride film 14 is formed. Then, a tungsten film 15 (second conductive film) is formed again on the titanium nitride film 14. Thereby, the seam portion 6 that has been exposed upward is tightly sealed.

Next, as FIG. 3C shows, the tungsten film 15, the titanium nitride film 14, and the titanium film 13 are removed from the interlayer insulating film 2 are removed by polishing using CMP, and the interlayer insulating film 2 is exposed. Thereby, the tungsten plug of Second Embodiment is completed.

In Second Embodiment, since the titanium film 13 and the titanium nitride film 14 are formed between the tungsten film 5 and the tungsten film 15, the adhesion of the tungsten film 5 and the tungsten film 15 can be enhanced. Also, when the tungsten film 5 and the tungsten film 15 are substituted by two kinds of different conductive materials as the materials for the plug, ohmic properties between these different materials can be improved, and the diffusion of conductive materials to each other can be prevented.

According to Second Embodiment, since the tungsten plug is made to be a two-stage structure consisting of a tungsten film 5 and a tungsten film 15, the seam portion 6 formed in the tungsten film 5 can be tightly sealed. Therefore, as in First Embodiment, the contact area with the overlying wiring can be widened, decrease in electrical resistance and the improvement of reliability such as EM resistance can be achieved, and the corrosion of the tungsten plug can be prevented. Furthermore, by the etch back of the tungsten film 5, the step of the mark portion can be deepened as in First Embodiment, and the accuracy of alignment and superposition test can be improved.

Third Embodiment

Figure 4:
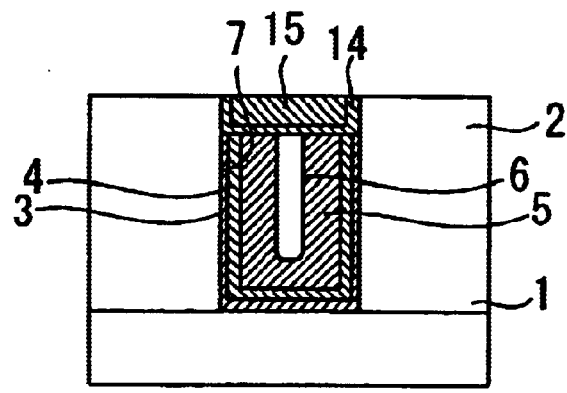
FIG. 4 is a schematic sectional view illustrating a semiconductor device according to Third Embodiment.

FIG. 4 is a schematic sectional view illustrating a semiconductor device according to Third Embodiment. A semiconductor device of Third Embodiment will be described below referring to FIG. 4. In FIG. 4, the same reference numerals are used for the same constituting components as in First and Second Embodiments.

FIG. 4 shows the state where only a titanium nitride film 11 has been formed as a barrier metal film after a tungsten film 5 has been etched back in the process step shown in FIG. 3B of Second Embodiment. Other structures are identical to those of Second Embodiment.

Thus, by forming the barrier metal film only from a titanium nitride film 11, the dissolution of titanium in the barrier metal film can be prevented during cleaning with a hydrogen fluoride solution after polishing the tungsten film 15 using CMP.

Since the tungsten plug is made to be a two-stage structure, as in First Embodiment, the contact area with the overlying wiring can be widened, decrease in electrical resistance and the improvement of reliability such as EM resistance can be achieved, and the corrosion of the tungsten plug can be prevented. Furthermore, the step of the mark portion can be deepened as in First Embodiment, and the accuracy of alignment and superposition test can be improved.

Fourth Embodiment

Figure 5A:
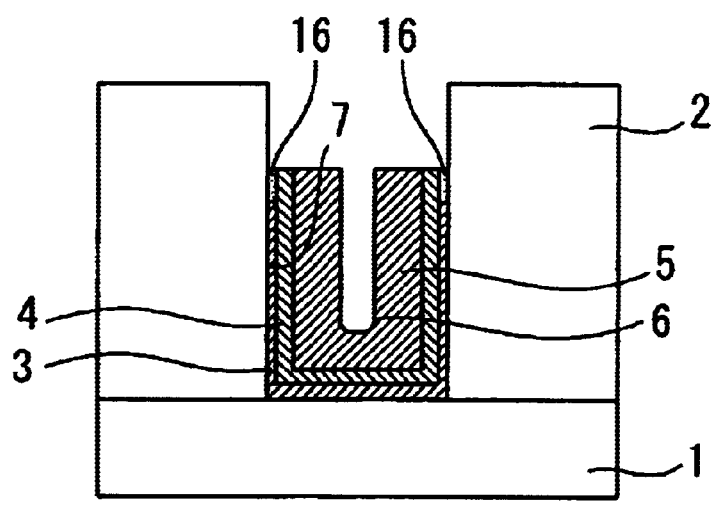
FIGS. 5A and 5B are schematic sectional views illustrating a method for manufacturing a semiconductor device according to Fourth Embodiment in the order of process steps.
Figure 5B:
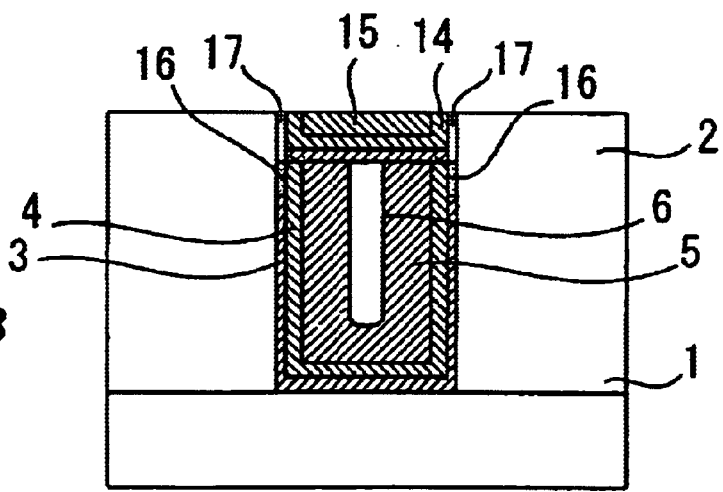

FIGS. 5A and 5B are schematic sectional views illustrating a method for manufacturing a semiconductor device according to Fourth Embodiment in the order of process steps. The structure and the manufacturing method of a semiconductor device according to Fourth Embodiment will be described below referring to FIGS. 5A and 5B. In FIGS. 5A and 5B, the same reference numerals are used for the same constituting components as in First and Second Embodiments.

In the manufacturing process of Fourth Embodiment, the process step shown in FIG. 1A of First Embodiment is carried out in the same manner as in First Embodiment. FIG. 5A shows the state where the tungsten film 5 has been etched back after the process step shown in FIG. 1A of First Embodiment. Here, in Fourth Embodiment, the interlayer insulating film 2 is used as the stopper for etch back. Therefore, as shown in FIG. 5A, in the contact hole 7, the titanium film 3 and the titanium nitride film 4 above the upper surface of the tungsten film 5 have been removed. Also, in the region other than the contact hole 7, the titanium film 3 and the titanium nitride film 4 on the interlayer insulating film 2 have been removed, and the interlayer insulating film 2 has been exposed. As in First Embodiment, a seam portion 6 is formed in the tungsten film 5.

In Fourth Embodiment, after the tungsten film 5 has been etched back, the titanium film 10 on the sidewall of the contact hole 7 is oxidized by oxygen ($O_2$) plasma treatment, or by annealing in an oxygen atmosphere. Thereby, a titanium oxide ($Ti_xO_y$) film 16 is formed on the titanium film 10, and the upward exposure of the titanium film 10 is prevented.

Thereafter, as FIG. 5B shows, a barrier metal film consisting of a titanium film 13 and a titanium nitride film 14 is formed as in Second Embodiment, and a tungsten film 15 is formed to seal the seam portion 6. Then, the tungsten film 15 is polished using CMP, and cleaning with a hydrogen fluoride solution is performed.

In cleaning with the hydrogen fluoride solution, the titanium film 13 exposed to the top is dissolved, and a gap 17 is formed. However, underneath the titanium film 13, since a titanium oxide film 16 is formed along the internal wall of the contact hole 7, the dissolution of titanium stops when the gap 17 reaches the titanium oxide film 16. Therefore, the dissolution of the titanium film 3 under the titanium oxide film 16 in the hydrogen fluoride solution can be inhibited, and the reaching of the gap 17 to the underlying conductive layer 1 can be prevented.

Since the tungsten plug is made to be a two-stage structure, as in First Embodiment, the contact area with the overlying wiring can be widened, decrease in electrical resistance and the improvement of reliability such as EM resistance can be achieved, and the corrosion of the tungsten plug can be prevented. Furthermore, the step of the mark portion can be deepened as in First Embodiment, and the accuracy of alignment and superposition test can be improved.

Fifth Embodiment

Figure 6A:
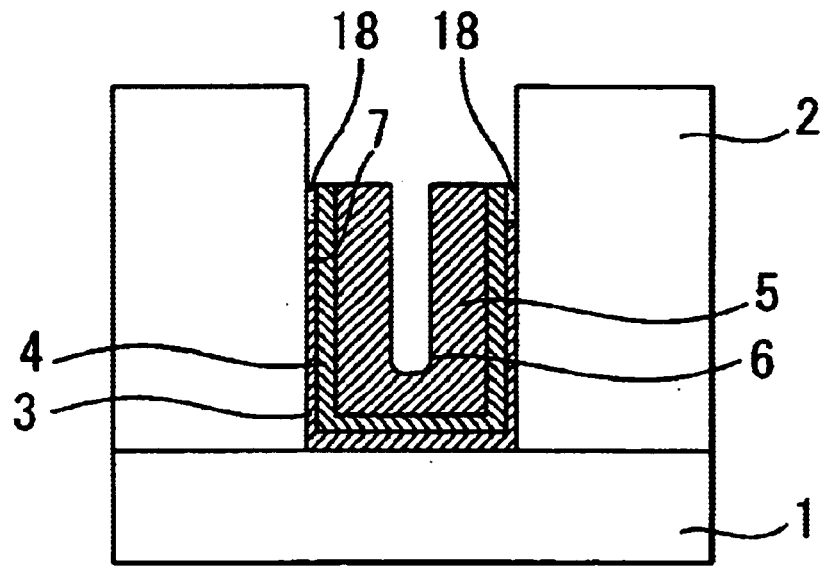
FIGS. 6A and 6B are schematic sectional views illustrating a method for manufacturing a semiconductor device according to Fifth Embodiment in the order of process steps.
Figure 6B:
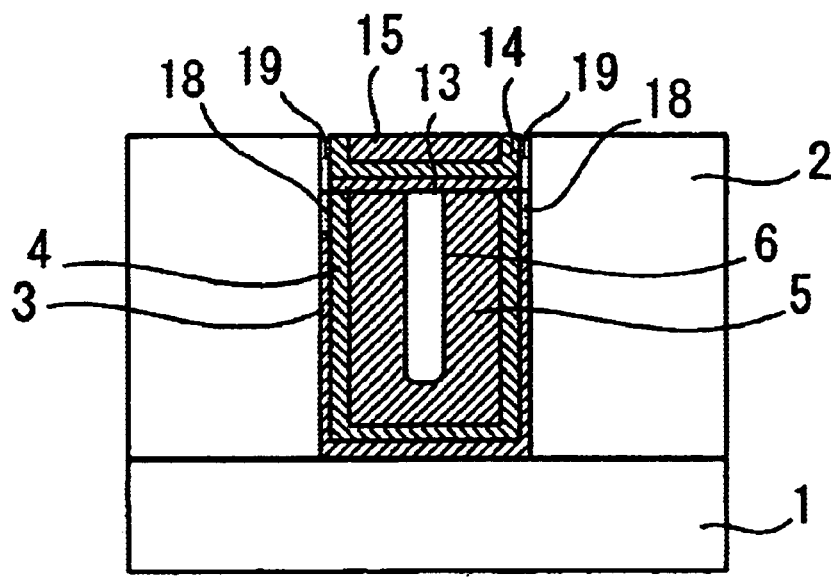
Figure 7A:
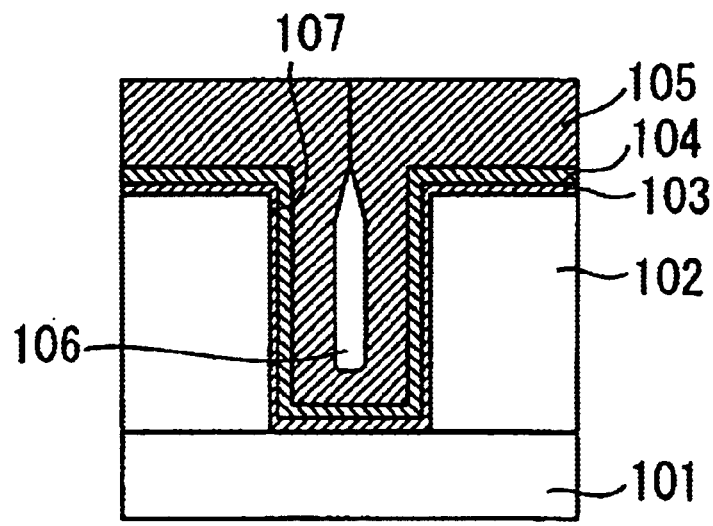
FIGS. 7A and 7B are schematic sectional views showing a method for forming a tungsten plug using CMP.
Figure 7B:
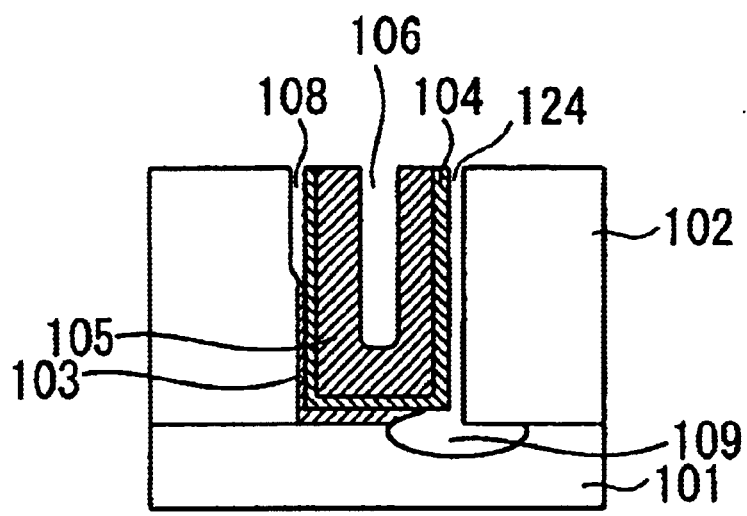
Figure 8A:
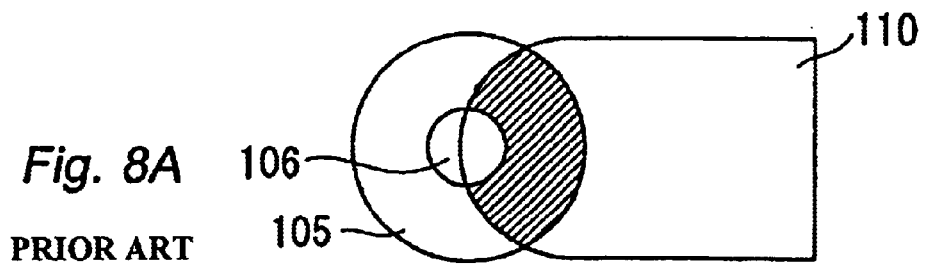
FIGS. 8A and 8B are plan views showing a decreased contact area of the tungsten film 105 with the overlying wiring.
Figure 8B:
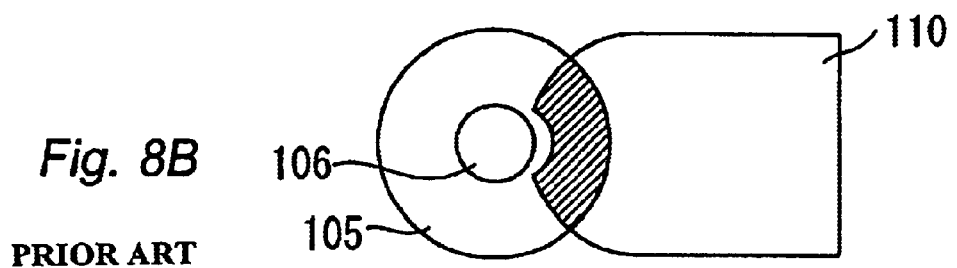
Figure 9A:
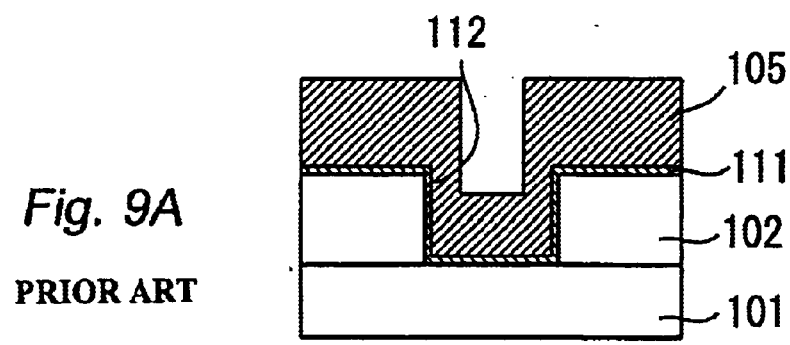
FIGS. 9A and 9B are schematic sectional views showing the state where the accuracy of the alignment and superposition test marks has been deteriorated.
Figure 9B:
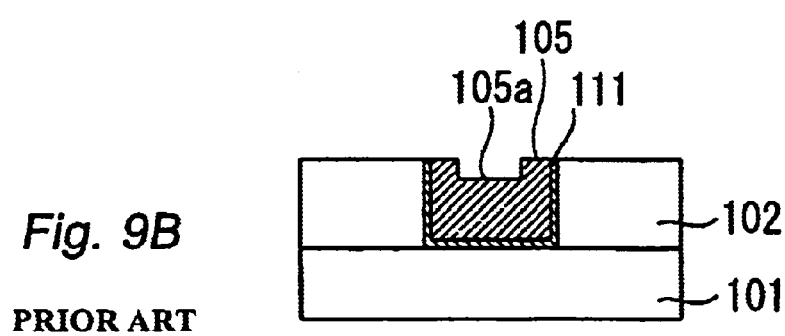

FIGS. 6A and 6B are schematic sectional views illustrating a method for manufacturing a semiconductor device according to Fifth Embodiment in the order of process steps. The structure and the manufacturing method of a semiconductor device according to Fifth Embodiment will be described below referring to FIGS. 6A and 6B. In FIGS. 6A and 6B, the same reference numerals are used for the same constituting components as in First Embodiment.

In the manufacturing process of Fifth Embodiment, the process step shown in FIG. 1A of First Embodiment is carried out in the same manner as in First Embodiment. FIG. 6A shows the state where the tungsten film 5 has been etched back after the process step shown in FIG. 1A of First Embodiment. Here, in Fifth Embodiment, the interlayer insulating film 2 is used as the stopper for etch back. Therefore, as shown in FIG. 6A, in the contact hole 7, the titanium film 3 and the titanium nitride film 4 above the upper surface of the tungsten film 5 have been removed. Also, in the region other than the contact hole 7, the titanium film 3 and the titanium nitride film 4 on the interlayer insulating film 2 have been removed, and the interlayer insulating film 2 has been exposed. As in First Embodiment, a seam portion 6 is formed in the tungsten film 5.

In Fifth Embodiment, after the tungsten film 5 has been etched back, the titanium film 10 on the sidewall of the contact hole 7 is nitrogenized by nitrogen ($N_2$) plasma treatment, or by annealing in an nitrogen atmosphere at a temperature of 600° C. or above. Thereby, a titanium nitride ($Ti_xN_y$) film 18 is formed on the titanium film 10, and the upward exposure of the titanium film 10 is prevented.

Thereafter, as FIG. 6B shows, a barrier metal film consisting of a titanium film 13 and a titanium nitride film 14 is formed as in Second Embodiment, and a tungsten film 15 is formed to seal the seam portion 6. Then, the tungsten film 15 is polished using CMP, and cleaning with a hydrogen fluoride solution is performed.

In cleaning with the hydrogen fluoride solution, the titanium film 13 exposed to the top is dissolved, and a gap 19 is formed. However, underneath the titanium film 13, since a titanium nitride film 18 is formed along the internal wall of the contact hole 7, the dissolution of titanium stops when the gap 19 reaches the titanium nitride film 18. Therefore, the dissolution of the titanium film 3 under the titanium nitride film 18 in the hydrogen fluoride solution can be inhibited, and the reaching of the gap 19 to the underlying conductive layer 1 can be prevented.

Since the tungsten plug is made to be a two-stage structure, as in First Embodiment, the contact area with the overlying wiring can be widened, decrease in electrical resistance and the improvement of reliability such as EM resistance can be achieved, and the corrosion of the tungsten plug can be prevented. Furthermore, the step of the mark portion can be deepened as in First Embodiment, and the accuracy of alignment and superposition test can be improved.

In the above-described embodiments, although tungsten, which has favorable filling properties, is used as an example of a material for a plug, copper, which has lower resistance, can also be used in place of tungsten. Also, although a laminated film consisting of a titanium film and a titanium nitride film is used as an example of a barriar metal film, a laminated film consisting of a tantalum film and a tantalum nitride film, or a three-layer laminated film consisting of a tantalum film, a tantalum nitride film, and a tantalum film can also be used. Furthermore, a single layer tantalum film, or a single layer tantalum nitride film can also be used.

Since the present invention is constituted as described above, the following effects can be obtained.

Since the conductor for filling the opening is made to be a two-stage structure consisting of a first conductive film and a second conductive film, the gap (seam portion) within the opening can be tightly sealed. Therefore, decrease in the contact area with the overlying wiring connected to the conductor by the gap can be inhibited. Thereby, the contact resistance with the overlying wiring can be reduced, and reliability such as EM resistance can be improved.

Since the diameter of the opening is made larger than the depth from the upper surface of the insulating film to the upper end of the first conductive film, the formation of a gap (seam portion) on the surface of the second conductive film can be inhibited.

Since a first adhering layer is formed on the internal wall and the bottom of the opening, the adhesion of the conductor to the inside of the opening can be enhanced, and the diffusion of the conductive materials constituting the conductor to other layers can be inhibited.

Since a second adhering layer is formed so as to cover the side and the lower surface of the second conductive film, the adhesion and ohmic properties of the first conductive film and the second conductive film can be improved, and the mutual diffusion of the conductive materials constituting the first conductive film and the second conductive film can be inhibited.

Since the upper end portion of the titanium film of the first adhering layer in the upper portion of the internal wall of the opening is oxidized or nitrogenized, the dissolution of the underlying titanium film due to the following cleaning step, the etching step, and the like, can be inhibited, and the formation of voids in the further underlying conductive layer and semiconductor substrate can be prevented.

Since the first conductive film is formed only on the circumferential portion along the internal wall of the opening, and the first conductive film is removed from a part of the bottom of the opening, a step can be formed on the upper surface in the vicinity of the center of the opening in formation of the second insulating film. Thereby on aligning, the step can be surely detected, and the adjustment of alignment and the accuracy of the superposition test in photoengraving can be significantly improved.

Since tungsten films are used as the first and second conductive films, it is ensured that even an opening having a large aspect ratio is completely filled. Also, by using copper films as the first and second conductive films, decrease in the resistance of the conductor can be achieved.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2001-361243, filed on Nov. 27, 2001 including specification, claims, drawings and summary, on which the Convention priority of the present application is based, are incorporated herein by reference in its entirety.

What is claimed is:

1. A method for manufacturing a semiconductor device comprising the steps of:

forming an insulating film on a semiconductor substrate;

forming first and second openings passing through said insulating film by selectively removing said insulating film, a width of said second opening being larger than a width of said first opening;

forming a first adhering layer so as to cover the internal wall and the bottom of said first and second opening;

forming a first conductive film so as to fill the area on said insulating film and in said first and second openings;

etching said first conductive film so that a) said first conductive layer is removed from said insulating film, and the upper surface of said first conductive film remaining in said first opening is lower than the upper surface of said insulating film therein forming a recess in said first opening, and b) in said second opening, said first conductive layer is removed on a bottom of said second opening, said first conductive film remaining on a part of the sidewall;

forming a second conductive film a) in said recess, b) in said second opening and c) on said insulating film; and filling said recess and said second opening with said second conductive film by polishing said second conductive film until said insulating film is exposed therein forming a mark on a surface of said second conductive film filled in said second opening.

2. The method for manufacturing a semiconductor device according to claim 1, further comprising the step of forming a second adhering layer on the bottom and the internal wall of said recess and in said second opening after the step for etching said first conductive film, wherein, in the step for forming said second conductive film, said second conductive film is formed in said recess through said second adhering layer.

3. The method for manufacturing a semiconductor device according to claim 2, wherein, in the step for forming said second adhering layer, said second adhering layer is formed as a laminated film containing a titanium film and a titanium nitride film, or a laminated film containing a tantalum film and a tantalum nitride film.

4. The method for manufacturing a semiconductor device according to claim 1, wherein, in the step for etching said first conductive film, said first conductive film is etched so that the depth of said recess is smaller than ½ the diameter of said opening.

5. The method for manufacturing a semiconductor device according to claim 1, wherein a tungsten film is formed as said first conductive film or second conductive film.

6. The method for manufacturing a semiconductor device according to claim 1, wherein a copper film is formed as said first conductive film or second conductive film.

7. The method for manufacturing a semiconductor device according to claim 1, wherein, in the step for forming said first adhering layer, said first adhering layer is formed as a laminated film containing a titanium file and a titanium nitride film or a laminated film containing a tantalum film and a tantalum nitride film.

8. The method for manufacturing a semiconductor device according to claim 1, wherein, in the step for forming said first adhering layer, said first adhering layer is formed as a laminated film containing a titanium film and a titanium nitride film, and the method further comprising the step for oxidizing or nitrogenizing the upper end portion of said titanium film on the internal wall of said first opening, after the step for etching said first conductive film.

* * * * *